(12) United States Patent
Brunolli et al.

(10) Patent No.: US 6,307,222 B1
(45) Date of Patent: *Oct. 23, 2001

(54) POWER/GROUND METALLIZATION ROUTING IN A SEMICONDUCTOR DEVICE

(75) Inventors: Michael J. Brunolli, Escondido; Behnan Malek-Khosravi; Nurtjahya Sambawa, both of La Jolla, all of CA (US)

(73) Assignee: Nurlogic Design, Inc., San Diego, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/368,074

(22) Filed: Aug. 3, 1999

Related U.S. Application Data

(63) Continuation of application No. 08/984,029, filed on Dec. 2, 1997, now Pat. No. 5,981,987.

(51) Int. Cl.[7] .................................................... H01L 27/10
(52) U.S. Cl. ............................................. 257/207; 257/211
(58) Field of Search .................................... 257/207, 211, 257/758

(56) References Cited

U.S. PATENT DOCUMENTS

| | | | |
|---|---|---|---|
| 4,870,300 | 9/1989 | Nakaya et al. | 307/303 |
| 4,928,160 | 5/1990 | Crafts | 357/54 |
| 5,237,184 | 8/1993 | Yonemanu et al. | 257/211 |
| 5,565,758 | 10/1996 | Yoeli et al. | 326/41 |
| 5,635,737 | 6/1997 | Yin | 257/204 |
| 5,656,834 | 8/1997 | Grzyb et al. | 257/207 |
| 5,981,987 | * 11/1999 | Brunolli et al. | 257/207 |

* cited by examiner

*Primary Examiner*—Mark V. Prenty
(74) *Attorney, Agent, or Firm*—Pillsbury Winthrop LLP

(57) ABSTRACT

A semiconductor device and a method of laying out the same includes routing primary power and ground distributions in the second metallization layer, rather than the first metallization as is conventionally done. This improves routability in the first metallization layer while providing sufficient current handling ability in the power and ground distributions.

10 Claims, 13 Drawing Sheets

POWER/GROUND METALLIZATION ROUTING IN A SEMICONDUCTOR DEVICE

This is a continuation of application Ser. No. 08/984,029 filed Dec. 2, 1997 now U.S. Pat. No. 5,981,987.

BACKGROUND OF THE INVENTION

1. Field of the Invention

The present invention relates to semiconductor integrated circuits, and more particularly, to power and ground metallization routing in a multi-metal layer semiconductor device having a plurality of basic cell circuits such as standard cells and gate array cells.

2. Description of the Related Art

FIG. 1 illustrates a conventional integrated circuit having a number of rows 3 of cells 5. The cells can have various widths W1, W2, W3, etc. and can be separated by small gaps (not shown). Power and ground are supplied to each cell from power and ground busses 7 and 9 via primary power and ground distributions 60 and 50, respectively. The primary power and ground distributions are typically laid out in the first metallization layer (i.e., "metal 1"). Moreover, metals in adjacent layers are laid out perpendicular to each other. That is, for example in a four-metal layer integrated circuit, wirings in the first and third metallization layers are laid out in one direction, and wirings on the substrate surface (e.g. polygate) and the second and fourth metallization layers are laid out in a direction perpendicular to the wirings in the first and third metallization layers.

As integration increases, rows 3 begin to abut with each other, causing the distance D1 to shrink to such a degree that the availability of the space between rows as channels for routing interconnections between cells in metal 1 is eliminated. Over-the-cell routers and other tools are thus required to route such interconnections in higher metal layers.

FIG. 2 illustrates the layout of a basic cell 5 that can be included in such a conventional integrated circuit as is illustrated in FIG. 1. It includes a PFET device region 10, a NFET device region 20, polygate 30, P-N device intraconnection 40, primary ground distribution 50, and primary power distribution 60. Contacts 70 connect power from primary power distribution 60 to the PFET device region, and contacts 80 connect ground from primary ground distribution 50 to the NEFT device region. Input pints 85 are provided to connect devices in this cell with devices in other cells by contact to polygate 30 through contact 95.

As can be seen, the primary power and ground distributions are laid out in metal 1 in an east-west direction. P-N intraconnections 40 and input pints 85 are also typically laid out in the first metallization layer. As should be apparent, to connect devices in cells in other rows to the input pins 85 and output pins (typically via connection to P-N intraconnection 40) of cell 5, such connections must be routed up and over the primary power and ground distributions through higher metal layers and then back down to metal 1 through vias and contact holes and the like.

FIG. 3 is a side plan view of the basic cell in FIG. 2 taken along sectional line 3—3. It shows primary power distribution 60 formed as the first metal layer over PFET device region 10, with polygate 30 (i.e., a gate formed of a layer of doped polysilicon on the substrate) and first insulator layer 90 interposed therebetween. Device region 10 is formed in substrate 1 and is separated from other device regions by oxide 35. Gate oxide layer 25 is interposed between polygate 30 and device region 10. Input pin 85 is connected to polygate 30 by contact 95 through first insulator layer 90.

The conventional technique of routing primary power and ground distributions in metal 1 is fraught with many problems. First, for example, due to the requirement of providing P-N intraconnections such as 40, and the fact that cell integration restricts the availability of cell interconnections between rows, very few cell interconnections can be routed in metal 1. Meanwhile, it is generally desirable to route as many interconnections as possible in lower metal layers so as to conserve routing resources in upper metal layers, and thus facilitate reduced average wire lengths.

Second, as cell integration increases, the number of devices per square area of the die increases, and hence the amount of current required to be carried on the primary power and ground distributions increases beyond the capabilities of the distribution lines. One solution to this problem involves making the primary power and ground distributions wider. However, certain minimum design distances such as D2 and D3 must be maintained so as to comply with the minimum feature requirements of the fabrication tools, for example. If the power and ground distributions are made wider, the device regions themselves must likewise be made wider, thus defeating higher cell integration. Moreover, an imbalance problem can arise even if the minimum feature requirements are maintained by increasing the size of a N device region, but without increasing the size of a P device region by a corresponding amount. This is because P devices are typically such weaker than N devices.

A second solution to the above-described current handling problem involves adding supplemental lines in metals 2 or 3.

FIG. 4 illustrates the technique of laying out supplemental line 110 in an east-west direction in metal 3 in parallel with primary power distribution 60 in metal 1. The primary and supplemental lines are connected through second insulator 100 and third insulator layer 105 by periodically provided stacked via and contacts 120. This solution effectively increases the width of the primary power distribution line. However, this effective increase in width may not be sufficient in extreme circumstances where many cells in the same row require current at the same time. Moreover, cells may have different dimensions, causing the primary distribution line to snake north and south and making it difficult to align the primary and supplemental lines.

FIG. 5 illustrates the technique of providing supplemental lines in metal 2. In this technique, supplemental power lines 115 are laid out in metal 2 in a north-south direction forming a matrix with the underlying primary power distributions. Inter-layer contacts are periodically provided to connect the supplemental power lines 115 and primary power distribution lines 60. This technique permits the current in each of the primary power distributions 60 to be shared in parallel so that a "hot" row of devices can draw current from other primary power distributions 60 associated with other rows. It should be apparent from the foregoing that the same technique could be applied for ground as well as power.

Although providing supplemental lines in metal 2 improves the ability of the primary power and ground distributions to provided desired amounts of current, other problems are created. For example, the supplemental line 115 in metal 2 can interfere with metal 1 pin locations and thus can prevent picking up device input and output pins. This further problem is illustrated in FIG. 6. As can be seen, when supplemental line 115 is laid out as shown in dashed lines, pin 85 is blocked, preventing any connection thereto unless a metal 1 interconnection can be made, which is unlikely. Accordingly, either the cell must be made wider or gaps must be provided between cells over which to lay out the supplemental line 115, as shown in FIG. 6. FIG. 7 is a side view of the cell in FIG. 6 taken along sectional line 7—7. As should be clear, either widening the cell or providing larger gaps between cells defeats higher cell integration.

Accordingly, there remains a need in the art for effective primary power and ground distributions in a basic cell that provides sufficient current handling ability while not impeding metal 1 routability or increased integration. The present invention fulfills this need.

SUMMARY OF THE INVENTION

An object of the present invention is to provide effective primary power and ground distributions in an integrated circuit having a plurality of cells.

Another object of the invention is to provide sufficient current handling ability of power and ground distributions in an integrated circuit having a plurality of cells.

Another object of the invention is to improve device interconnection routability in an integrated circuit having a plurality of cells.

Another object of the invention is to improve cell integration.

Another object of the invention is to improve the ability to provide supplemental lines to primary power and ground distributions.

Another object of the invention is to improve P/N device balancing.

Another object of the invention is to reduce average wire lengths.

These and other objects of the invention are fulfilled by the present invention. In a preferred form, the invention includes primary power and ground distributions in the second metallization layer, rather than the first metallization as is conventionally done. This improves routability in the first metallization layer while providing sufficient current handling ability in the power and ground distributions.

BRIEF DESCRIPTION OF THE DRAWINGS

The above objects and advantages the present invention, among others, will become apparent to those skilled in the art after considering the following detailed specification, together with the accompanying drawings wherein.

DETAILED DESCRIPTION OF THE PREFERRED EMBODIMENTS

Figure 8:
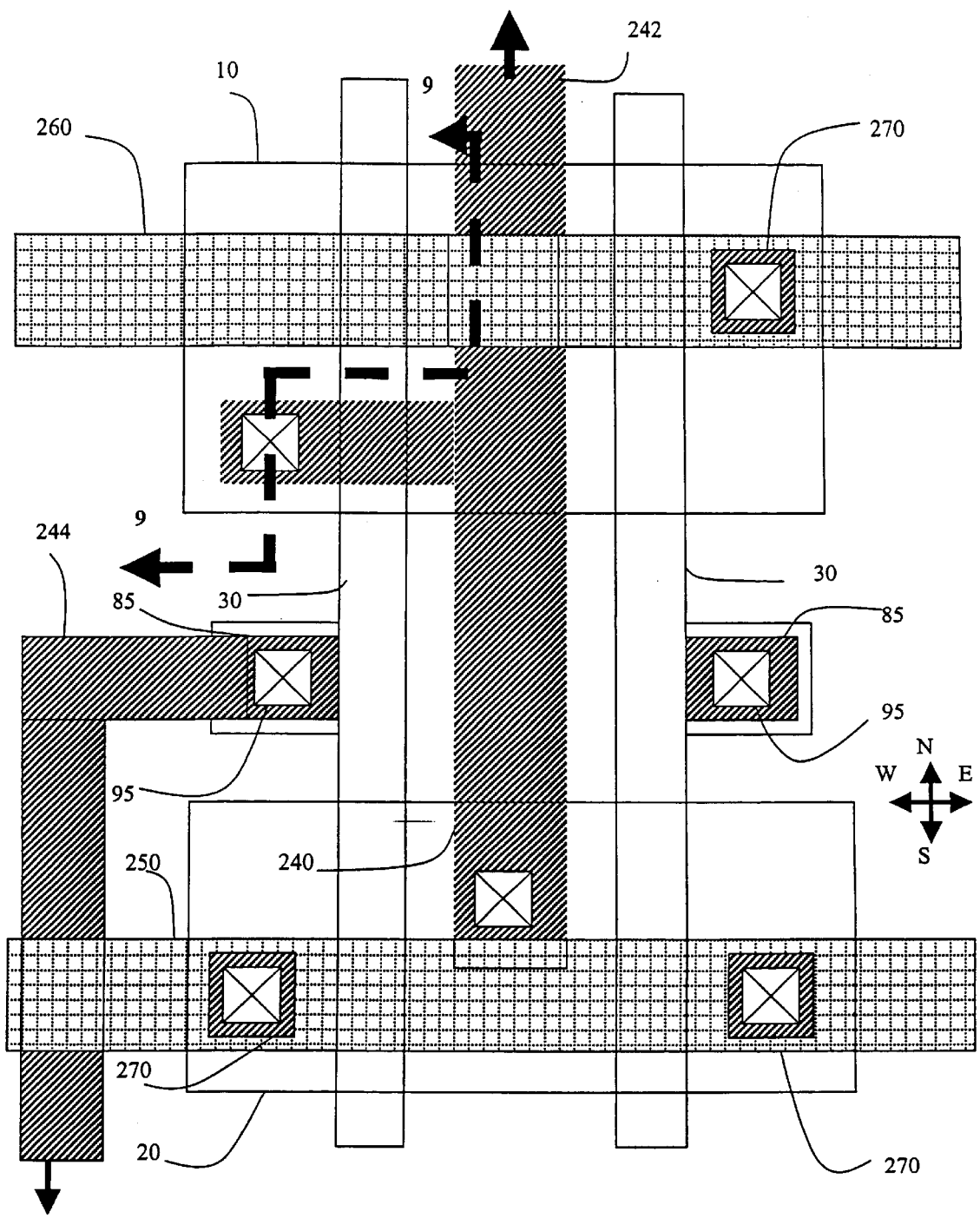
FIG. 8 illustrates the layout of a basic cell with power and ground distribution routing in accordance with the present invention.

FIG. 8 illustrates the layout of a basic cell layout using power and ground distribution routing in accordance with the present invention. It includes PFET device region 10, NFET device region 20, polygate 30, P-N device intraconnection 240, primary ground distribution 250, primary power distribution 260, cell output interconnection 242 and cell input interconnection 244. Stacked via and contact hole 270 connects power from primary power distribution 260 to the PFET device region, as will be described in more detail below.

Contrary to the conventional techniques, the primary power and ground distributions are formed as the second metallization layer in the basic cell, and are routed in an east-west direction. P-N device intraconnection 240, cell output interconnection 242, and cell input interconnection 244 are formed in the first metallization layer, and can be routed in both north-south and east-west directions. Other elements can be the same as in the conventional cell and their repeated detailed explanation here is not necessary for an understanding of the invention.

As should be apparent, the routability of inter-cell connections in metal 1 is enhanced due to the lack of primary power and ground distributions in metal 1. In the example illustrated in FIG. 8, P-N device intraconnection 240 can be connected to cell output interconnection 242 so as to provide the output of this cell to a cell in a northern row in metal 1, while input pin can be connected to cell input interconnection 244 so as to supply the input of this cell from a cell in a southern row. Other examples and alternatives of connecting the inputs and outputs of cells in metal should be immediately apparent to those skilled in the art.

As should be further apparent, cell integration can be dramatically improved using the power and ground distribution routing in accordance with the invention. Not only does the improved routability of cell interconnections in metal 1 conserve routing resources in higher metal layers and reduce average wire lengths, but the device regions can be made smaller due to the ability, for example, to overlap portions of P-N device intraconnection 240 with primary power and ground distributions 250 and 260. Further, the N device region can be made smaller relative to the P device region, thus allowing for better P/N balance.

Figure 9:
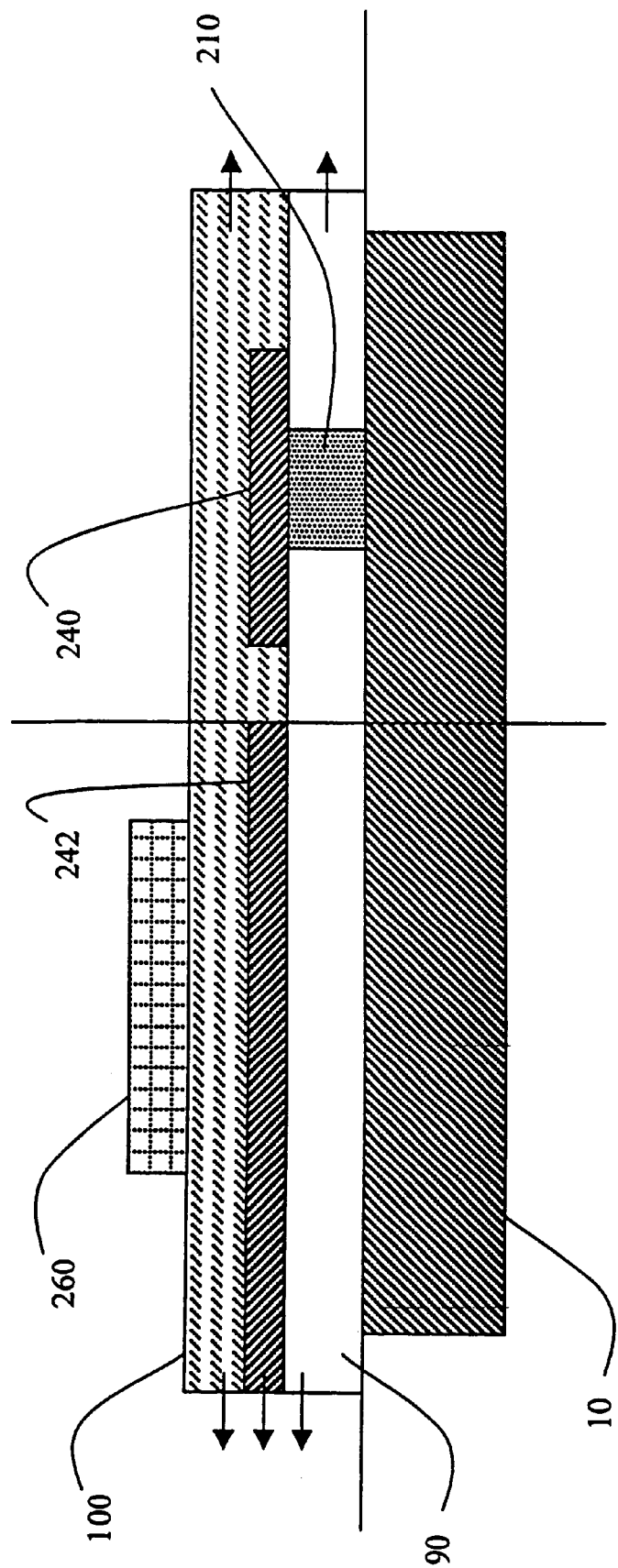
FIG. 9 is a side view of the basic cell illustrated in FIG. 8 taken along sectional line 9—9.

FIG. 9 is a side plan view of the basic cell in FIG. 8 taken along sectional line 8—8. It shows primary power distribution 260 formed as the second metallization layer over PFET device region 10, with first insulator layer 90 and second insulator layer 100 interposed therebetween. It also further graphically illustrates how cell output interconnection 242 can be freely routed in metal 1 to connect devices in the basic cell in FIG. 8 via contact 210 with other cells north and south of the cell.

The primary power and ground distributions can be connected to the respective device regions using many known techniques. However, in a preferred embodiment of the invention illustrated in FIG. 8, primary power distribution 260 is connected to the PFET device region through stacked via and contact 270. By using a stacked via and contact such as that illustrated, the use of metal 1 is minimized, thus further improving the routability of other interconnections in metal 1.

Further advantages of routing the primary power and ground distributions in metal 2 rather than in metal 1 are as follows. First, the power and ground distributions in metal 2 can be made as wide as necessary to handle the current required to supply the integrated circuit devices. Moreover, metal 2 layers are trending toward being thicker than metal 1, further enhancing the current capacity of the power and ground distributions in metal 2.

Figure 1:
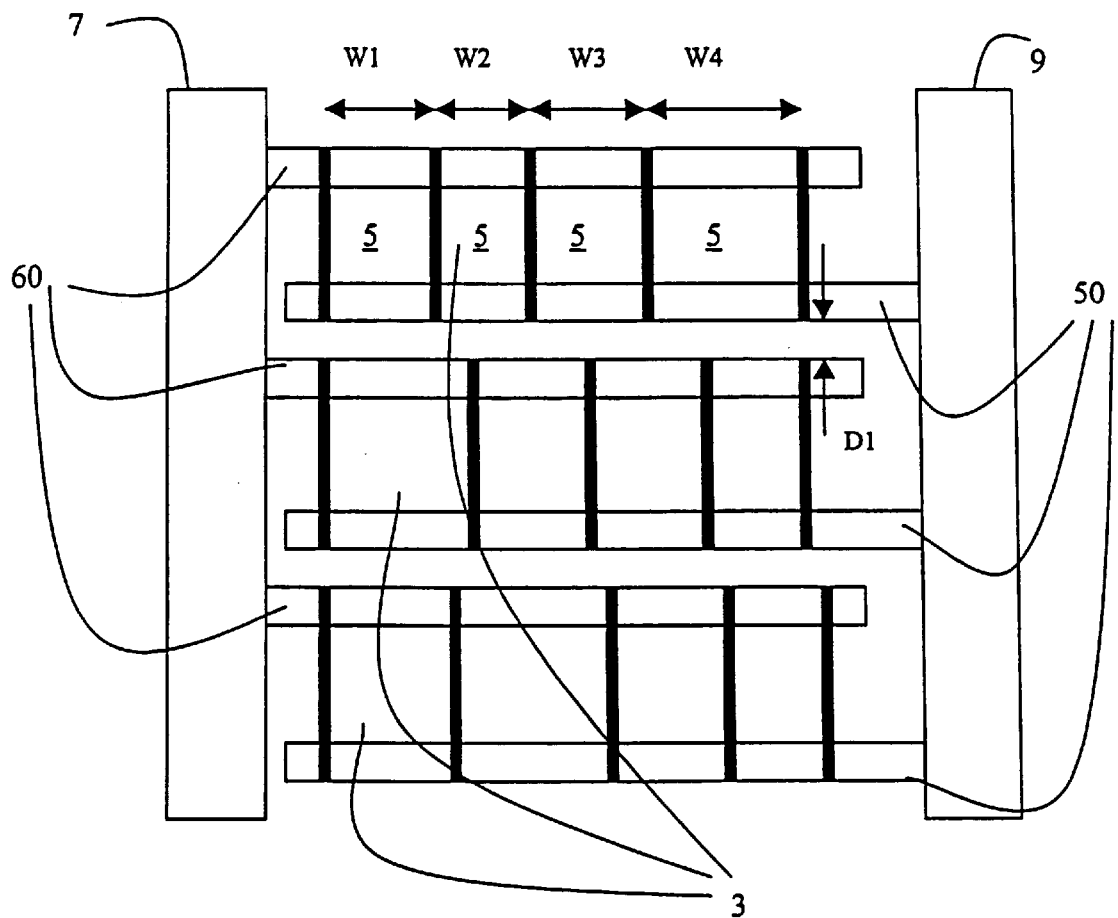
FIG. 1 illustrates the layout of a conventional integrated circuit having rows of cells.
Figure 2:
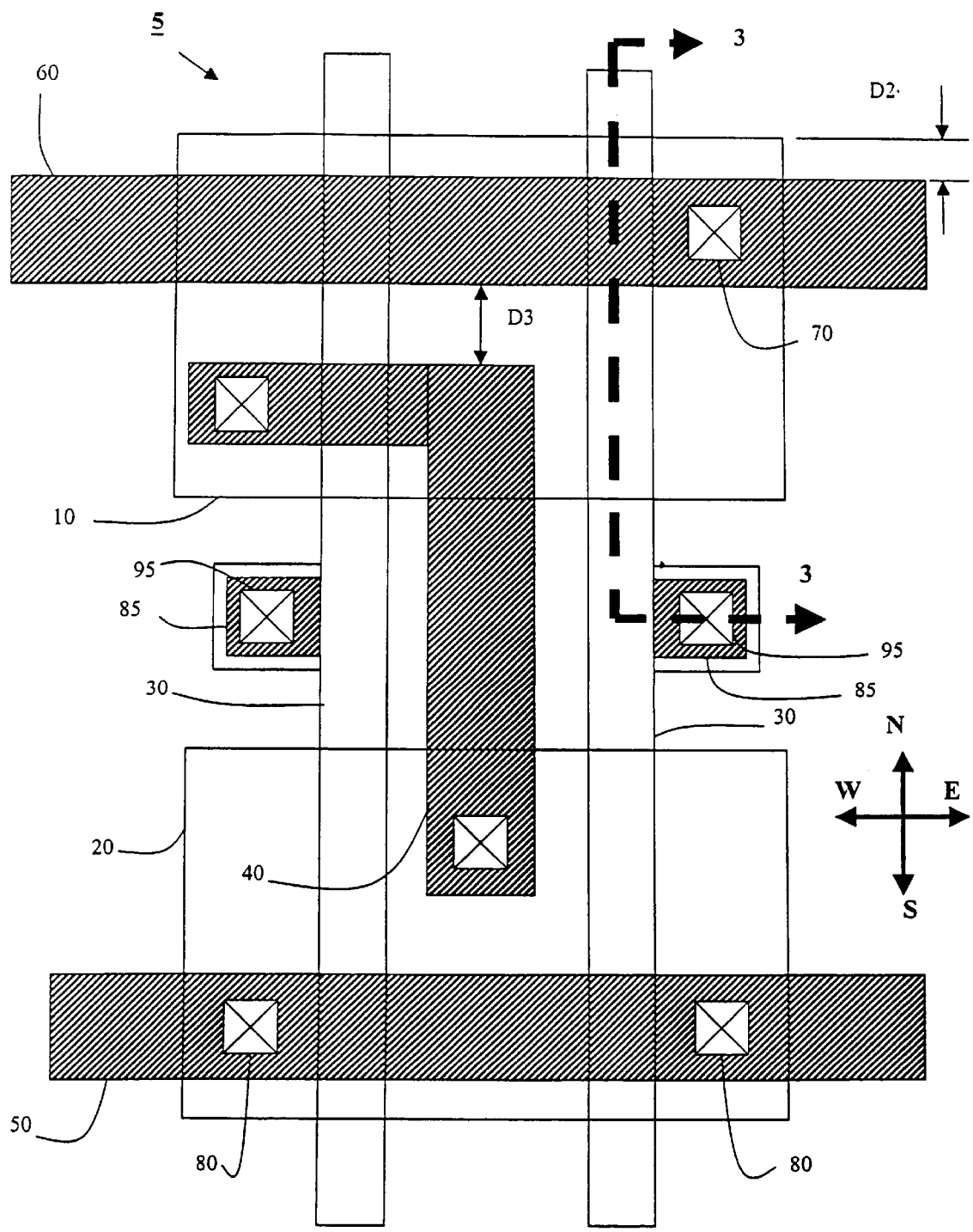
FIG. 2 illustrates the layout of a basic cell in a conventional integrated circuit such as that illustrated in FIG. 1.
Figure 3:
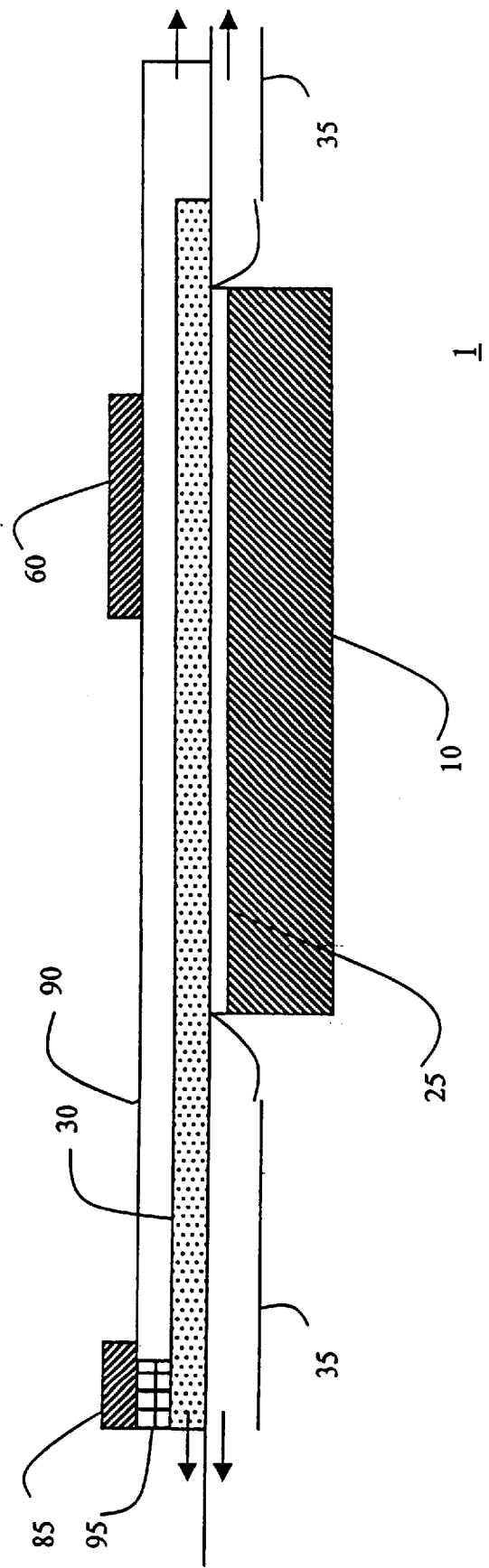
FIG. 3 is a side view of the conventional cell in FIG. 1 taken along sectional line 2—2.
Figure 4:
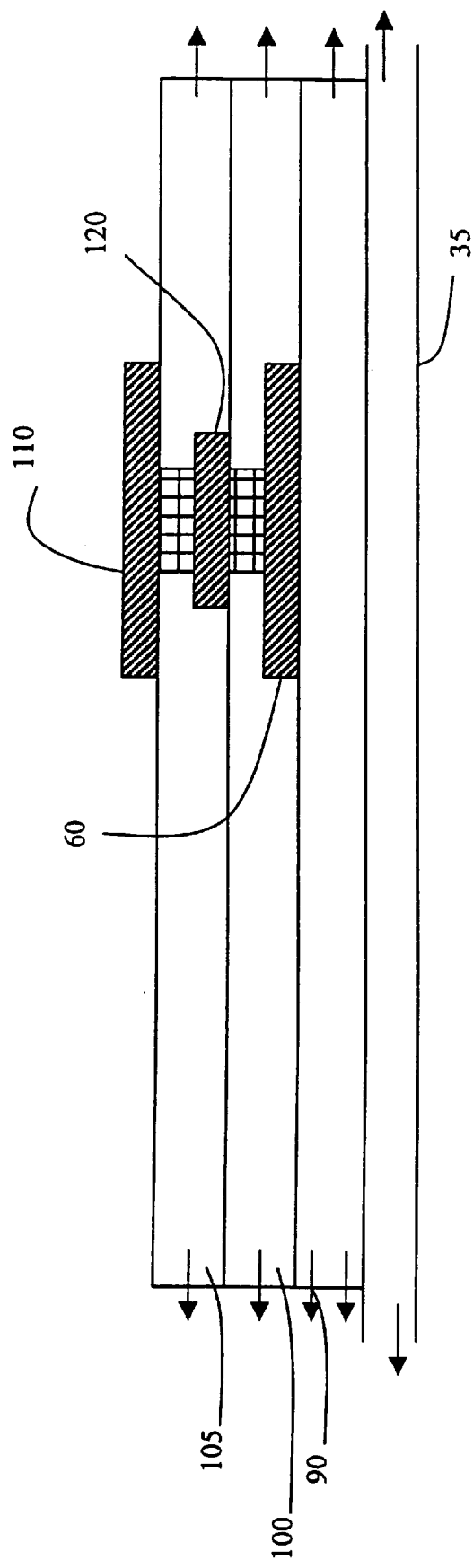
FIG. 4 illustrates the conventional technique of providing supplemental power and ground distributions in metal 3 in the conventional integrated circuit.
Figure 5:
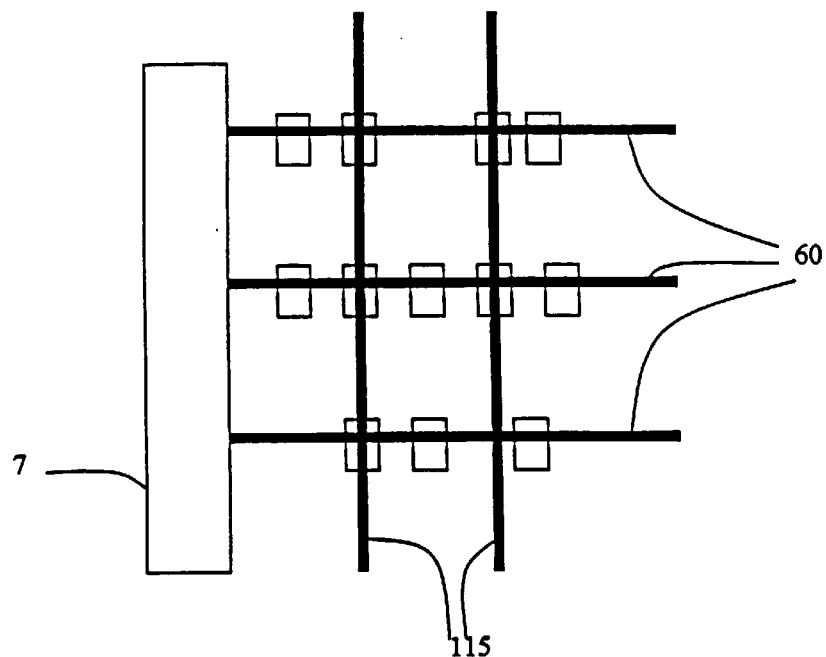
FIG. 5 illustrates the conventional technique of providing supplemental power and ground distributions in metal 2 in the conventional integrated circuit.
Figure 6:
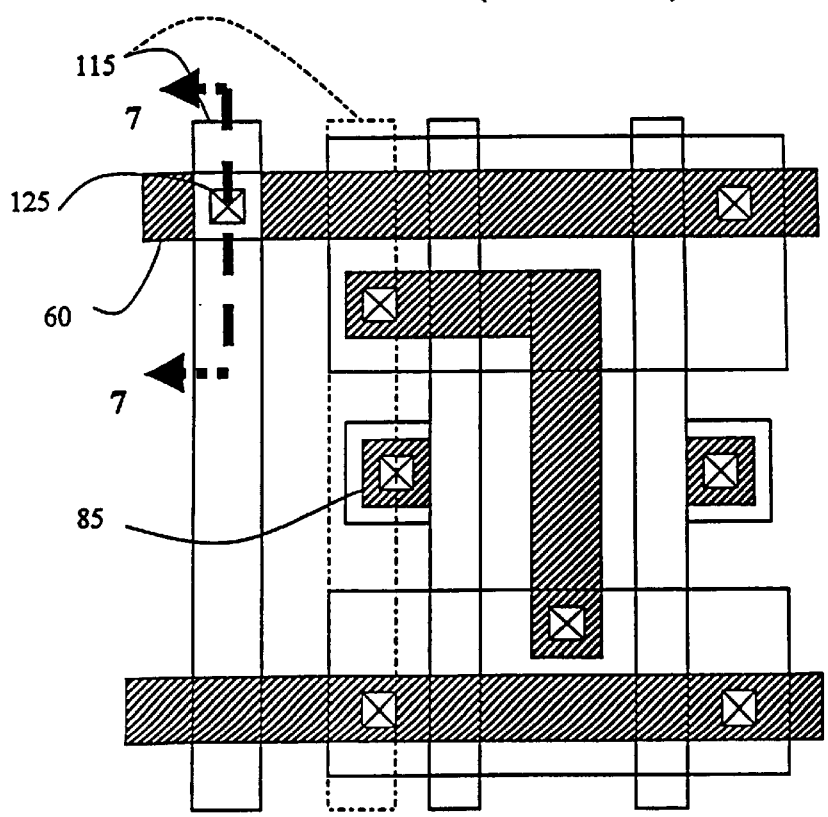
FIG. 6 further illustrates the conventional technique of providing supplemental power and ground distributions in metal 2 in the conventional integrated circuit.
Figure 7:
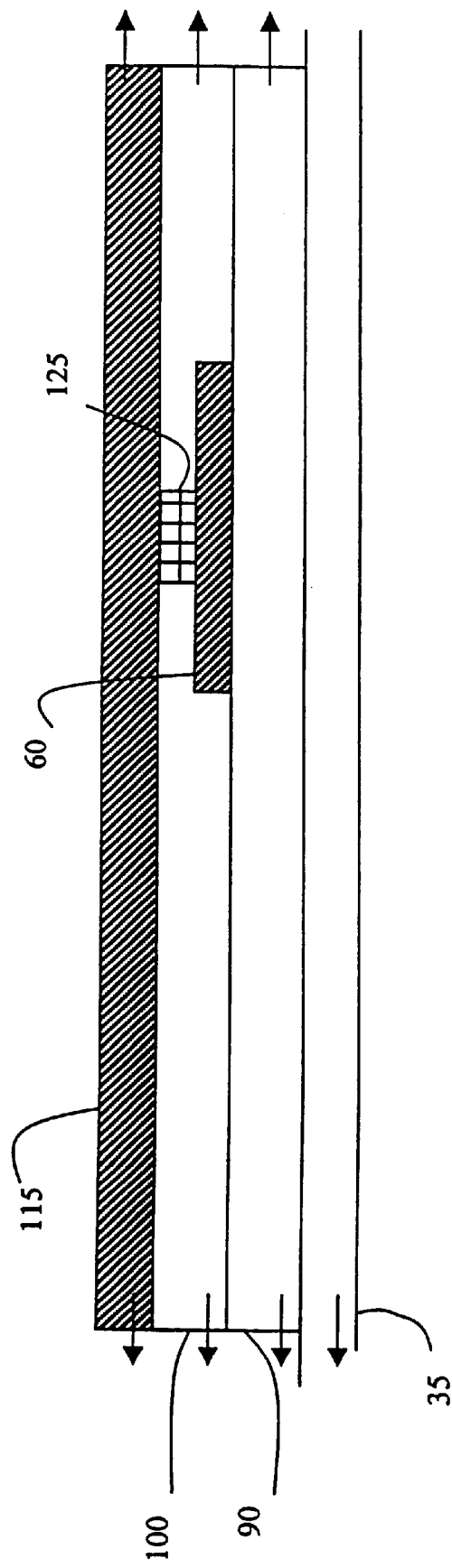
FIG. 7 is a side view of the conventional cell in FIG. 6 taken along sectional line 7—7.
Figure 10:
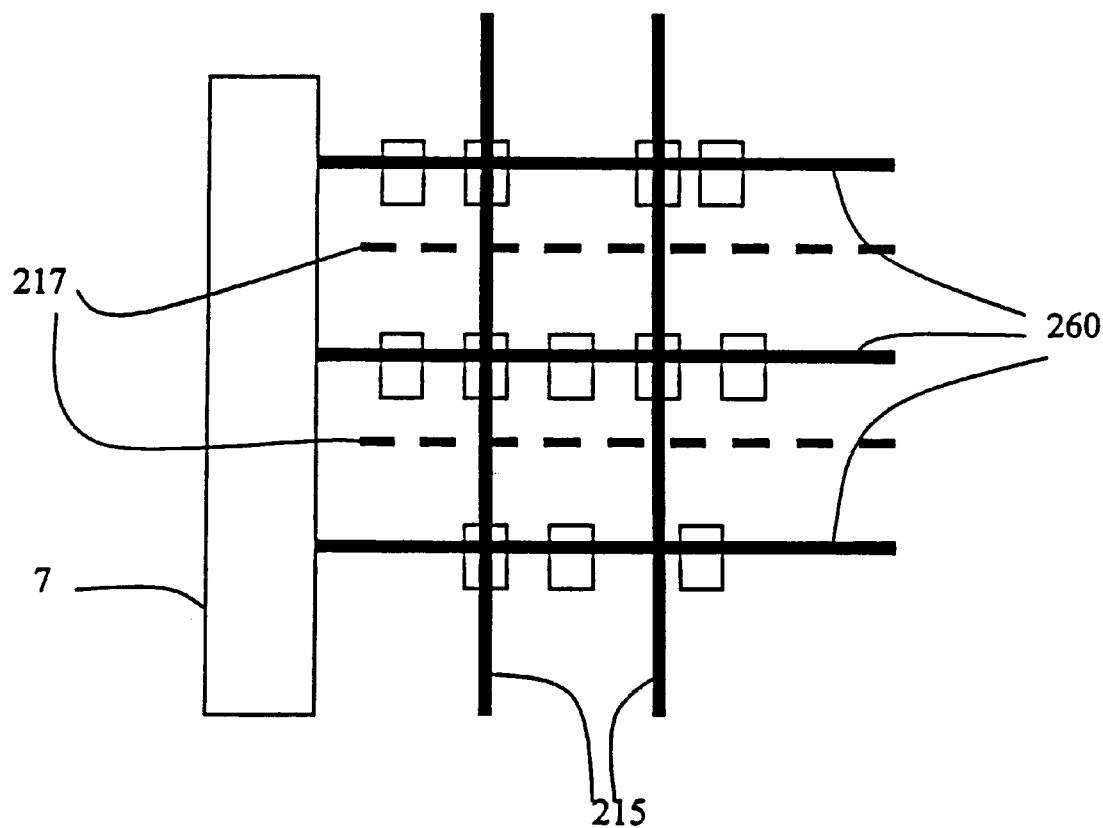
FIG. 10 illustrates providing supplemental lines in metal 3 and metal 4 in accordance with the principles of the present invention.

As illustrated in FIG. 10, if supplemental power and ground distributions are still required, supplemental lines 215 can be provided in metal 3 in a matrix fashion with the primary distributions in metal 2, with periodic connections therebetween. Furthermore, second supplemental lines 217 in metal 4 can be further provided in a matrix fashion with the supplemental lines in metal 3, with periodic connections therebetween. It should be apparent that the pin blocking problem described with reference to FIG. 6 is alleviated in the present invention by the ability to access pins in metals 1 and 2.

Figure 11:
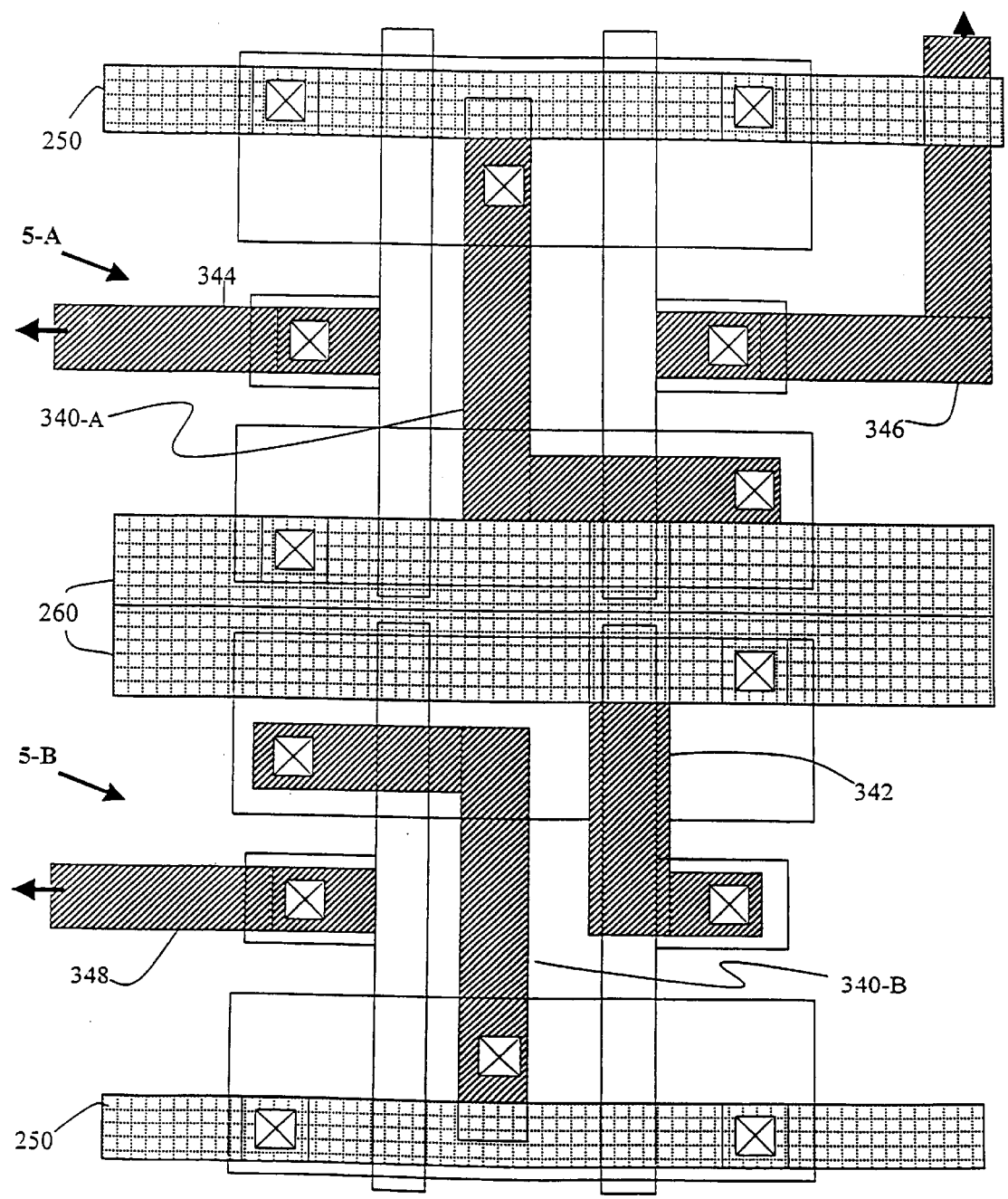
FIG. 11 illustrates inter-cell connections in metal 1 in accordance with the principles of the present invention.

FIG. 11 illustrates how cells 5-A and 5-B in neighboring rows can be interconnected with each other and with other cells in metal 1 in accordance with the principles of the invention. This example shows the output of cell 5-A connected with the input of cell 5-B by cell interconnection 342, while other inputs of both cells are connected with cells in the same and other rows by cell interconnections 344, 346 and 348.

Figure 12:
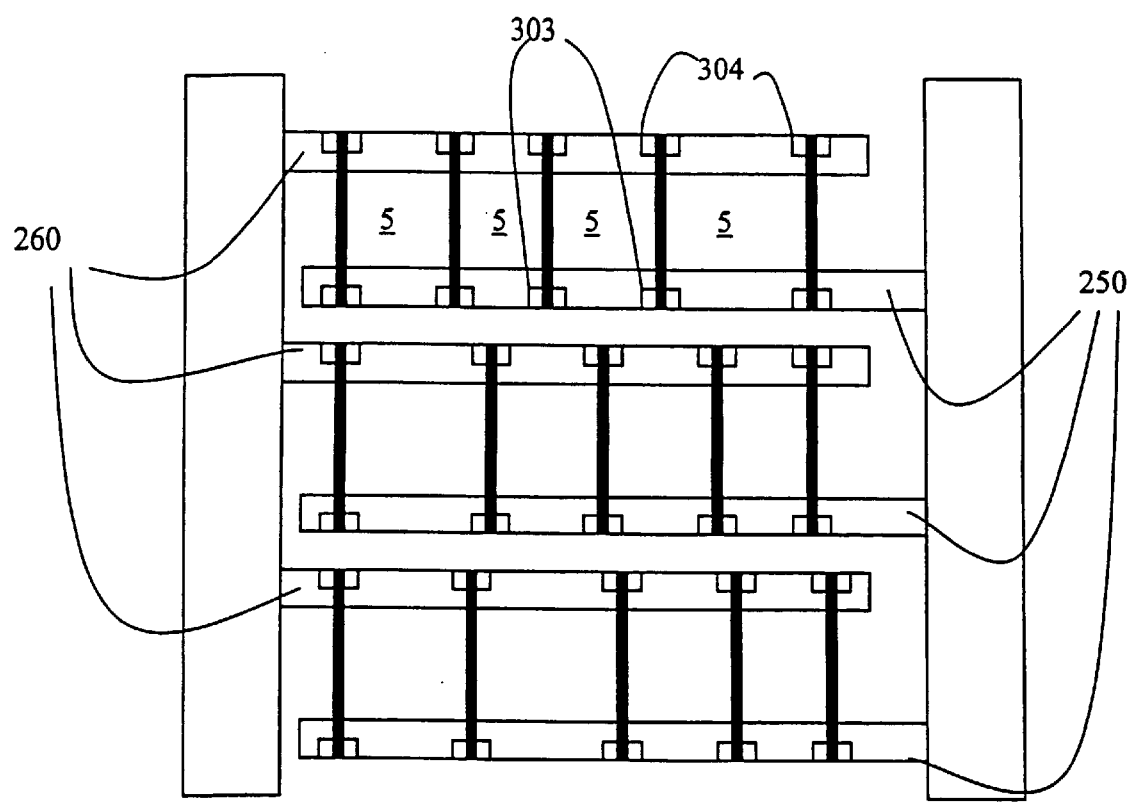
FIG. 12 illustrates providing substrate and well ties in an integrated circuit in accordance with the invention.

Although substrate and well ties can be provided in many known ways, FIG. 12 illustrates providing substrate and well ties in a manner preferred by the present invention. In the example shown in FIG. 12, substrate ties 303 and well ties 304 are provided at the corners of every cell, with adjacent cells in the same row sharing the same substrate and well ties, so as to connect ground and power respectively to substrate and N-wells in each cell. By providing the substrate and well ties in this manner, routability in metal 1 in both north-south and east-west directions is not significantly impeded.

Figure 13:
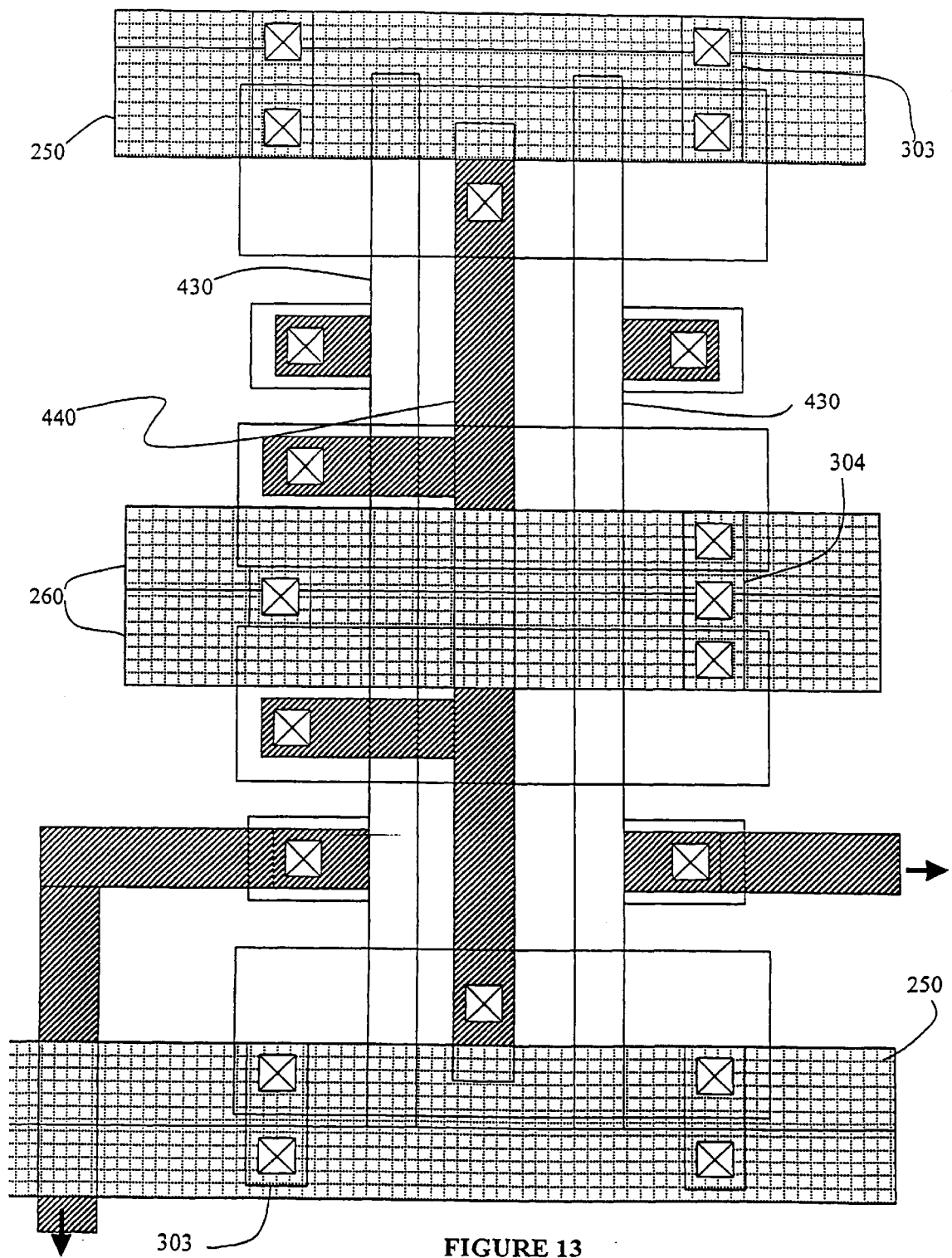
FIG. 13 illustrates a multi-height basic cell in accordance with the principles of the present invention.
Figure 14:
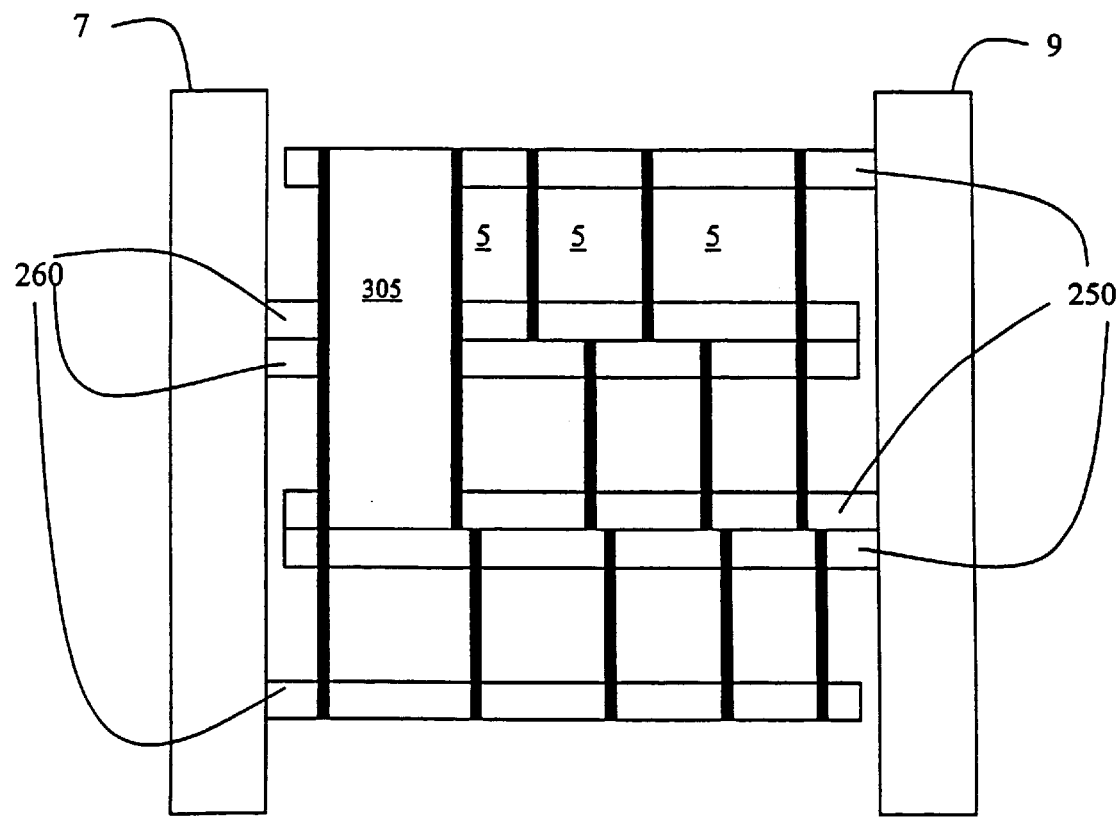
FIG. 14 further illustrates providing multi-height basic cells in an integrated circuit in accordance with the invention.

Yet another advantage of the primary power and ground distribution routing of the present invention is illustrated in FIG. 13. By virtue of the improved routability of cell interconnections in metal 1, multi-height cells can be more easily provided that before. FIG. 13 shows an example of a double-height cell 305 linked together by device intraconnection 440 in metal 1. Double-height cell 305 can be considered a stronger version of the basic cell illustrated in FIG. 8, with more input and output pin locations, thus further enhancing the routability of interconnections in metal 1. FIG. 14 further illustrates how a multi-height cell such as double-height cell 305 can be provided in an integrated circuit having a plurality of single-height cells 5. This advantage of the invention is particularly important for integrated circuit designs where complicated cell structures having many input and output pins are required. FIGS. 13 and 14 also illustrate another example of how substrate and well ties 303 and 304 are provided in accordance with the invention.

It should be noted that although the routing techniques of the present invention have been described hereinabove with particular reference to integrated circuits having standard cells, the principles of the invention can also be applied to gate arrays having predetermined basic gate array cells.

Accordingly, although this invention has been described in detail with reference to the preferred embodiments thereof, those skilled in the art will appreciate that various substitutions and modifications can be made to these examples without departing from the spirit of the invention as defined in the appended claims.

We claim:

1. A basic cell in an integrated circuit having a plurality of cells, said basic cell including:
    a first conductivity device region;
    a second conductivity device region;
    a first metal layer formed over said first and second conductivity device regions, said first metal layer comprising interconnections between devices formed in said first and second conductivity device regions and other of said plurality of cells;
    a second metal layer formed over said first metal layer, said second metal layer comprising primary power and ground distributions; and
    means for conducting current respectively between said primary power and ground distributions and said first and second conductivity device regions.

2. A basic cell as defined in claim 1, wherein said means conducting current comprises a stacked via and contact.

3. A basic cell as defined in claim 1, wherein said primary power and ground distributions are routed in a first direction, and said interconnections are routed in said first direction and in a second direction different than said first direction.

4. A basic cell as defined in claim 1, wherein said basic cell is a standard cell.

5. A basic cell as defined in claim 1, wherein said basic cell is a gate array cell.

6. A basic cell as defined in claim 1, further comprising:
    a third metal layer formed above said second metal layer, said third metal layer comprising supplemental power and ground lines, said primary power and ground distributions being routed in a first direction and said supplemental power and ground lines being routed in a second direction different than said first direction; and
    means for conducting current respectively between said supplemental power and ground lines and said primary power and ground distributions.

7. A basic cell as defined in claim 6, further comprising:
    a fourth metal layer formed above said third metal layer, said fourth metal layer comprising second supplemental power and ground lines, said second supplemental power and ground lines being routed in said first direction; and
    means for conducting current respectively between said second supplemental power and ground lines and said supplemental power and ground distributions.

8. A layout method in an integrated circuit having a plurality of cells, each of said cells including a first conductivity device region and a second conductivity device region, said method comprising:
    providing interconnections between said cells in a first metal layer formed over said first and second conductivity device regions;
    providing primary power and ground distributions in a second metal layer formed over said first metal layer; and providing means for conducting current respectively between said primary power and ground distributions and said first and second conductivity device regions.

9. A method as defined in claim 8, wherein said means providing step comprises providing a stacked via and contact between said power and ground distributions and said first and second conductivity device regions.

10. A method as defined in claim 8, further comprising:
routing said primary power and ground distributions in a first direction; and
routing said interconnections in said first direction and in a second direction different than said first direction.

* * * * *